US009024562B2

(12) United States Patent
Tazawa et al.

(10) Patent No.: US 9,024,562 B2
(45) Date of Patent: May 5, 2015

(54) MOTOR CONSTANT CALCULATING METHOD FOR PM MOTOR, AND MOTOR CONSTANT CALCULATING DEVICE

(75) Inventors: Toru Tazawa, Osaka (JP); Masaru Nishizono, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 103 days.

(21) Appl. No.: 13/825,206

(22) PCT Filed: Sep. 28, 2011

(86) PCT No.: PCT/JP2011/005445
§ 371 (c)(1),
(2), (4) Date: Mar. 20, 2013

(87) PCT Pub. No.: WO2012/046409
PCT Pub. Date: Apr. 12, 2012

(65) Prior Publication Data
US 2013/0181650 A1    Jul. 18, 2013

(30) Foreign Application Priority Data

Oct. 8, 2010  (JP) ................. 2010-228289

(51) Int. Cl.
*H02P 29/00* (2006.01)
*H02P 23/14* (2006.01)
*H02P 5/00* (2006.01)
*H02P 6/12* (2006.01)
*G01R 31/34* (2006.01)

(52) U.S. Cl.
CPC ........ *H02P 29/00* (2013.01); *H02P 6/12* (2013.01); *G01R 31/34* (2013.01); *H02P 23/14* (2013.01)

(58) Field of Classification Search
USPC ............ 318/490, 438, 400.13, 400.2, 400.32, 318/400.01
See application file for complete search history.

(56) References Cited

U.S. PATENT DOCUMENTS

| 6,462,492 | B1* | 10/2002 | Sakamoto et al. ........ 318/400.32 |
| 6,570,358 | B2* | 5/2003 | Nakatsugawa et al. ....... 318/727 |
| 6,700,400 | B2* | 3/2004 | Atarashi .................. 318/400.01 |
| 6,822,417 | B2* | 11/2004 | Kawaji et al. ................. 318/701 |
| 6,869,272 | B2* | 3/2005 | Odachi et al. ................ 417/44.1 |
| 7,005,810 | B2* | 2/2006 | Ueda et al. ..................... 318/114 |

(Continued)

FOREIGN PATENT DOCUMENTS

| CN | 101054969 A | 10/2007 |
| JP | 06-273496 A | 9/1994 |

(Continued)

OTHER PUBLICATIONS

International Search Report for International Application No. PCT/JP2011/005445, dated Dec. 27, 2011, 2 pages.

(Continued)

*Primary Examiner* — Paul Ip
(74) *Attorney, Agent, or Firm* — Brinks Gilson & Lione (57) ABSTRACT

A motor constant calculating method for a PM motor according to the present invention includes a voltage applying step of applying an applied voltage including a DC component and a plurality of frequency components to a PM motor, a motor current detecting step of detecting a motor current flowing depending on the applied voltage applied in the voltage applying step, and a motor constant calculating step of calculating a motor constant of the PM motor based on the applied voltage and the motor current.

14 Claims, 6 Drawing Sheets

(56) References Cited

U.S. PATENT DOCUMENTS

| | | | |
|---|---|---|---|
| 7,151,348 B1* | 12/2006 | Ueda et al. | 318/114 |
| 7,825,620 B2* | 11/2010 | Nakatsugawa et al. | 318/800 |
| 7,852,022 B2* | 12/2010 | Kono et al. | 318/135 |
| 8,044,618 B2* | 10/2011 | Nakatsugawa et al. | 318/400.02 |
| 8,742,704 B2* | 6/2014 | Nakatsugawa et al. | 318/400.02 |
| 2002/0113615 A1* | 8/2002 | Atarashi | 324/772 |
| 2002/0167289 A1* | 11/2002 | Nakatsugawa et al. | 318/727 |
| 2004/0183487 A1* | 9/2004 | Ueda et al. | 318/114 |
| 2004/0201358 A1* | 10/2004 | Kawaji et al. | 318/701 |
| 2007/0241698 A1 | 10/2007 | Sung et al. | |
| 2008/0018284 A1* | 1/2008 | Kinpara et al. | 318/490 |
| 2008/0079378 A1 | 4/2008 | Nakatsugawa et al. | |
| 2008/0169775 A1* | 7/2008 | Kono et al. | 318/135 |
| 2009/0140674 A1* | 6/2009 | Nakatsugawa et al. | 318/400.02 |
| 2009/0237013 A1* | 9/2009 | Sato | 318/400.02 |
| 2009/0322262 A1* | 12/2009 | Tobari et al. | 318/400.02 |
| 2010/0118569 A1* | 5/2010 | Kono et al. | 363/34 |
| 2012/0007528 A1* | 1/2012 | Nakatsugawa et al. | 318/400.02 |
| 2013/0285588 A1* | 10/2013 | Ito et al. | 318/490 |

FOREIGN PATENT DOCUMENTS

| | | |
|---|---|---|
| JP | 07-055899 A | 3/1995 |
| JP | 2000-050700 A | 2/2000 |
| JP | 2000-312498 A | 11/2000 |
| JP | 2008-086129 A | 4/2008 |
| JP | 2009-183062 A | 8/2009 |
| JP | 2009-232573 A | 10/2009 |

OTHER PUBLICATIONS

English language translation of Search Report issued in Chinese Application No. 201180048675.8, dated Feb. 12, 2015, 3 pages.

* cited by examiner

MOTOR CONSTANT CALCULATING METHOD FOR PM MOTOR, AND MOTOR CONSTANT CALCULATING DEVICE

This application is a 371 application of PCT/JP2011/005445 having an international filing date Sep. 28, 2011, which claims priority to JP2010-228289 filed Oct. 8, 2010, the entire contents of which are incorporated herein by reference.

TECHNICAL FIELD

The present invention relates to a motor constant calculating method for a PM motor and a motor constant calculating device.

BACKGROUND ART

In recent years, in order to control a PM motor at high accuracy, motor constants such as an armature resistance and an inductance of the motor must be accurately comprehended. For example, in position sensorless control in which a magnetic polar position of the PM motor is controlled without a sensor, many methods of estimating magnetic polar positions by using motor constants are employed. In vector control of a PM motor, current control is popularly employed, and motor constants are used to properly set a gain of a current control unit.

Thus, some techniques that easily require motor constants of a PM motor without rotating the motor are known (for example, refer to, PTL 1). A technique disclosed in PTL 1 requires a value of a wire wound resistor based on an input voltage and an input current obtained when a DC current is caused to flow in a PM motor. Fundamental wave components of an input voltage and an input current obtained when an AC current is caused to flow in a PM motor are extracted, and an inductance is calculated based on the magnitudes of the input voltage and the input current and a phase difference between the input voltage and the input current. In this manner, motor constants of the PM motor are calculated.

Another technique that calculates motor constants of a PM motor is disclosed in, for example, PTL 2. According to PTL 2, voltages obtained when DC currents having different high and low levels are caused to flow are stored. A difference between the stored voltages having the two levels is divided by a difference between currents having two levels to calculate a value of a wire wound resistor. At the same time, a time until a current obtained when a voltage based on a DC current at a high level is sharply changed into a voltage based on a DC current having a low level changes into a predetermined value is measured. Based on the measured time and the calculated value of the wire wound resistor, an inductance is calculated.

However, in PTL 1, in order to calculate the value of the wire wound resistor, a time until a DC current caused to flow in the PM motor is set in a steady state is required. Since the value of the wire wound resistor and the inductance are measured by using different test signals, long times are disadvantageously required for the measurement. Furthermore, detection accuracy of a phase difference is deteriorated unless a frequency of an AC current caused to flow in order to calculate an inductance is properly set. For this reason, an error of the measured phase difference becomes large.

On the other hand, also in PTL 2, like in PTL 1, in order to calculate a value of a wire wound resistor, a time until a DC current caused to flow in a PM motor is set in a steady state is required. Since the value of the wire wound resistor and the inductance are measured by using different test signals, long times are disadvantageously required for the measurement. Furthermore, when a time until a current flowing when a voltage having a high level is sharply changed into a voltage having a low level changes into a predetermined value is measured, determination of a level and a measured time easily include errors. In a motor in which inductances change depending on the magnitude of a current, since a response does not have a predetermined time constant, an accurate inductance cannot be calculated.

PLT 1: Unexamined Japanese Patent Publication No. 2000-312498
PLT 2: Unexamined Japanese Patent Publication No. 2009-232573

SUMMARY OF THE INVENTION

A motor constant calculating method according to the present invention includes a voltage applying step of applying an applied voltage including a DC component and a plurality of frequency components to a PM motor, a motor current detecting step of detecting a motor current flowing depending on the applied voltage applied in the voltage applying step, and a motor constant calculating step of calculating a motor constant of the PM motor based on the applied voltage and the motor current.

In this manner, a motor constant of the PM motor can be calculated at high accuracy within a short period of time.

DETAILED DESCRIPTION OF THE PREFERRED EMBODIMENTS

Exemplary embodiments of the present invention will be described below with reference to the drawings. The present invention is not limited to the exemplary embodiments.

First Exemplary Embodiment

A motor constant calculating method and a motor constant calculating device for a PM motor in a first exemplary embodiment of the present invention will be described below with reference to FIG. 1.

Figure 1:
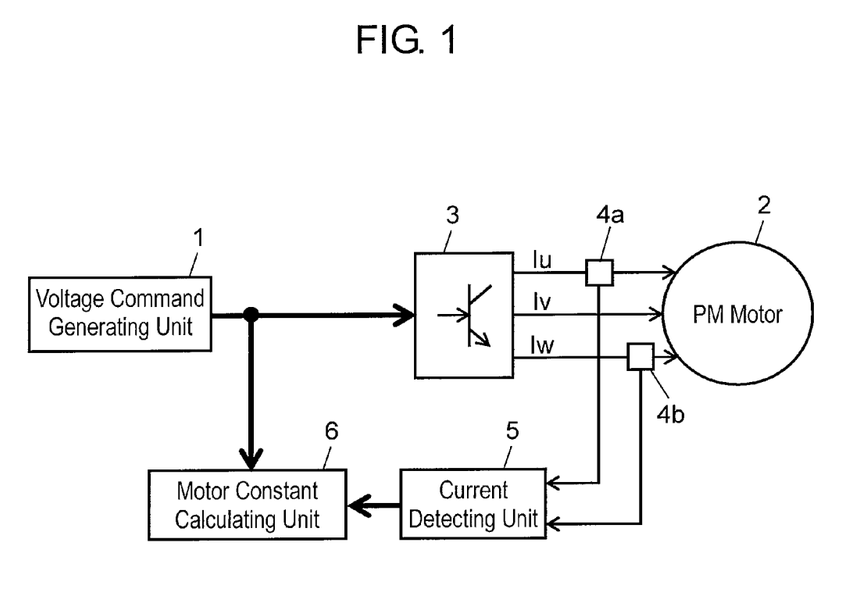
FIG. 1 is a block diagram showing a configuration of a motor constant calculating device for a PM motor in a first exemplary embodiment of the present invention.

FIG. 1 is a block diagram showing a configuration of a motor constant calculating device for a PM motor in the first exemplary embodiment of the present invention. The block diagram in FIG. 1 shows only a functional part required for the motor constant calculating device for a PM motor. Relationships between functions of functional blocks and the functional blocks will be described with reference to FIG. 1.

As shown in FIG. 1, the motor constant calculating device for a PM motor according to the exemplary embodiment includes at least voltage command generating unit 1, PM motor 2, inverter 3, current detectors 4a and 4b, current detecting unit 5, and motor constant calculating unit 6.

More specifically, the motor constant calculating device for a PM motor shown in FIG. 1 drives PM motor 2 by operations of the functional blocks described below.

More specifically, voltage command generating unit 1 generates a voltage command of an applied voltage applied to PM motor 2 to calculate a motor constant. Inverter 3 receives a voltage command output from voltage command generating unit 1 to apply the applied voltage to PM motor 2. Current detector 4a and current detector 4b detect at least motor currents Iu and Iw flowing from inverter 3 to PM motor 2. Current detecting unit 5 converts motor currents detected by current detectors 4a and 4b into motor current detection values. Motor constant calculating unit 6 calculates a motor constant of PM motor 2 based on a voltage command output from voltage command generating unit 1 and an input of a motor current detection value output from current detecting unit 5.

Operations and functions of the functional blocks will be described below by using FIG. 2 to FIG. 4B with reference to FIG. 1.

Figure 2:
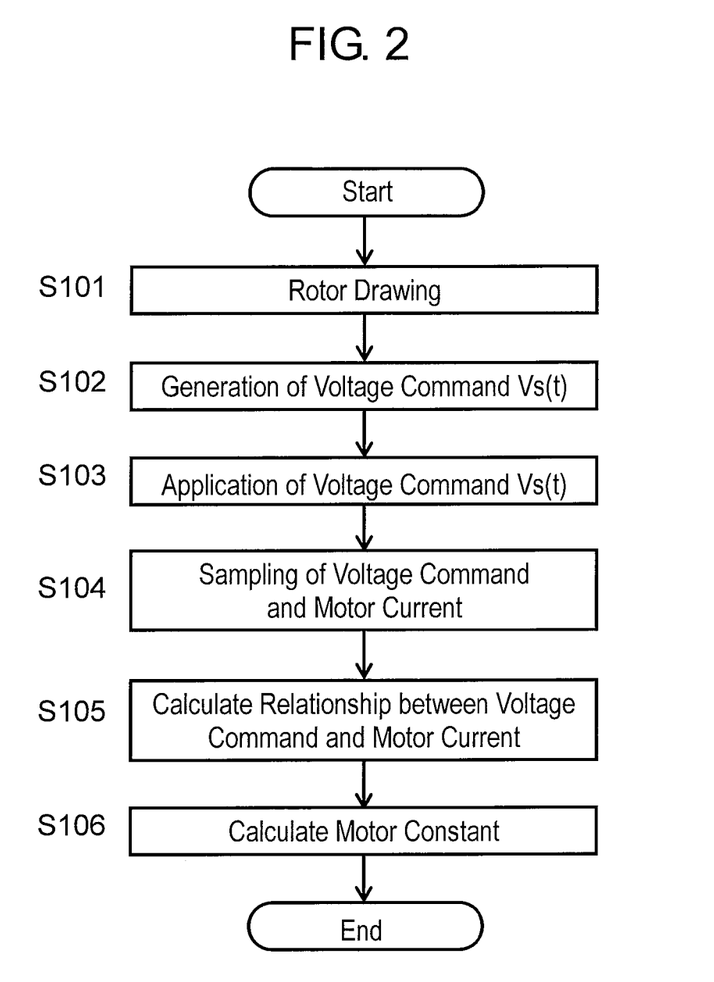
FIG. 2 is a flow chart showing a flow of a process of calculating a motor constant in the first exemplary embodiment of the present invention.
Figure 3:
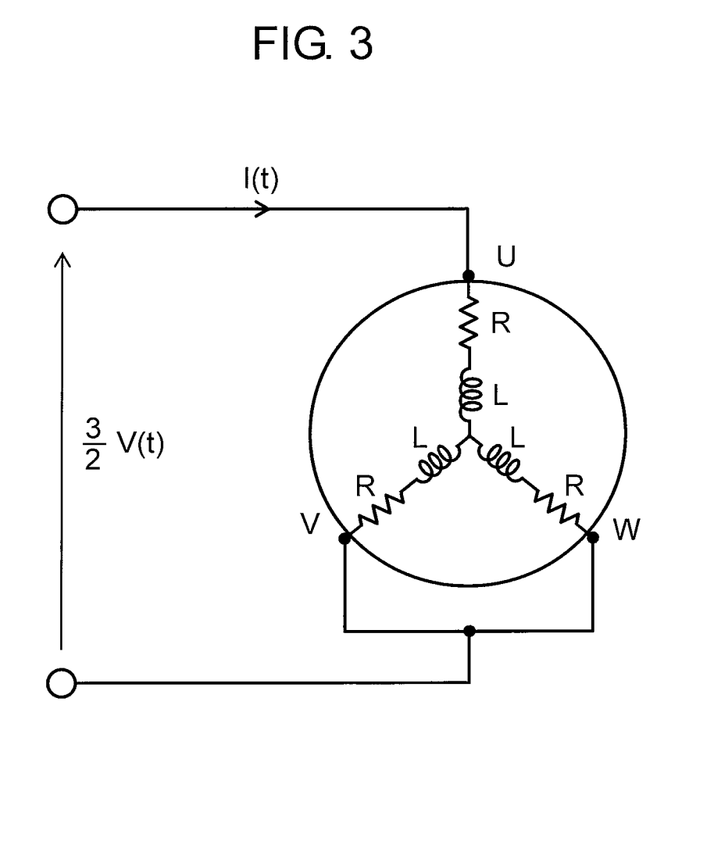
FIG. 3 is an equivalent circuit diagram for explaining a single-phase energization state of a PM motor.
Figure 4A:
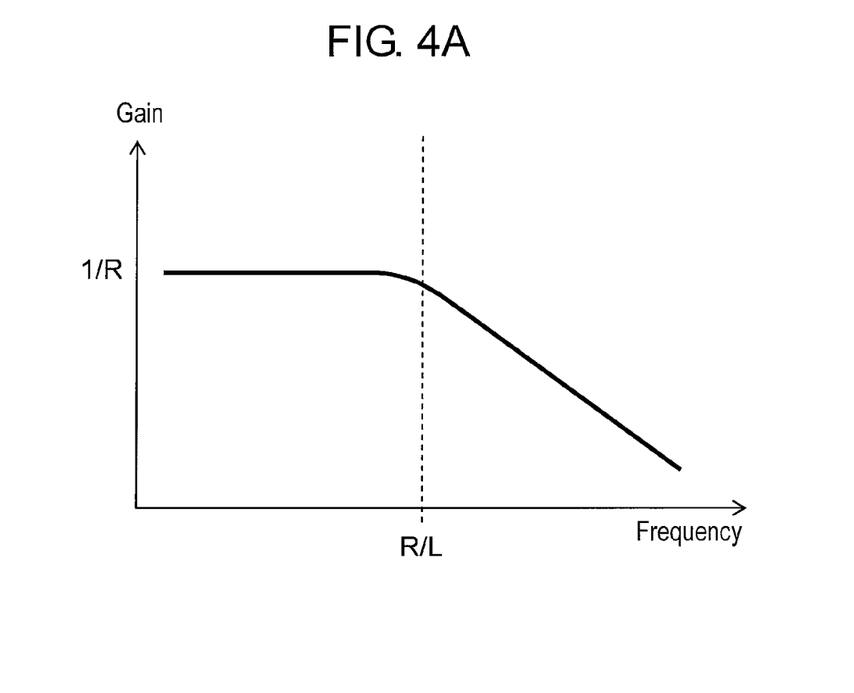
FIG. 4A is a graph showing a frequency characteristic of a transfer function (gain) of the PM motor.
Figure 4B:
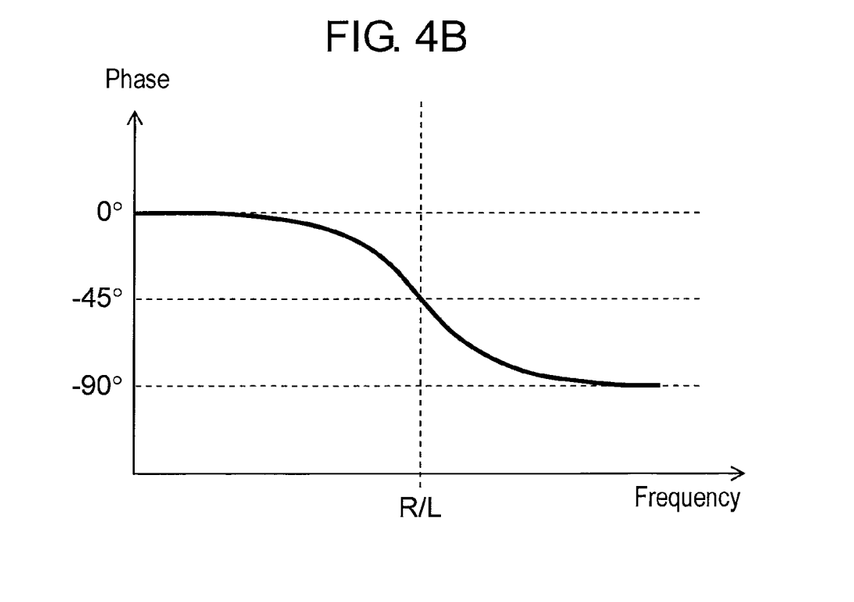
FIG. 4B is a graph showing a frequency characteristic of a transfer function (phase) of the PM motor.

FIG. 2 is a flow chart showing a flow of a process of calculating a motor constant in the first exemplary embodiment of the present invention. FIG. 3 is an equivalent circuit diagram for explaining a single-phase energization state of a PM motor. FIG. 4A is a graph showing a frequency characteristic of a transfer function (gain) of the PM motor. FIG. 4B is a graph showing a frequency characteristic of a transfer function (phase) of the PM motor.

As shown in FIG. 2, when the process of calculating a motor constant is started, inverter 3 applies a DC voltage to PM motor 2 to draw a rotor of PM motor 2 to a predetermined position. This is because, since the rotor in PM motor 2 may be rotated by applied the voltage due to a magnet being present on the rotor, the rotor of PM motor 2 is fixed to a predetermined position in advance. For this reason, calculation of a motor constant is preferably performed in a state in which the rotor of PM motor 2 stands still. Thus, for example, DC voltage Va is applied to a U phase and DC voltage −Va/2 is applied to a V phase and a W phase to draw the rotor of PM motor 2 to a predetermined position (step S101). DC voltage Va is set as a voltage obtained when a current almost equal to the rated current of PM motor 2 flows in, for example, application of a voltage such that the rotor of PM motor 2 is sufficiently drawn to the predetermined position.

At this time, an equivalent circuit of PM motor 2 obtained after the rotor of PM motor 2 is drawn to the predetermined position is shown in FIG. 3. More specifically, as shown in FIG. 3, since the rotor of PM motor 2 does not rotate, the equivalent circuit of PM motor 2 includes phase resistance R and phase inductance L to apply a single-phase applied voltage across U-VW phases. In this manner, a current axis (d-axis) and an axis of magnetic poles are matched with each other.

Voltage command generating unit 1 generates voltage command Vs(t) serving as an applied voltage applied to PM motor 2 to calculate a motor constant (step S102). More specifically, as shown in (Equation 1), voltage command Vs(t) obtained by adding Vn(t) having a plurality of frequency components to DC component V0 is generated. At this time, as voltage command Vn(t), for example, an M-sequence signal (Maximum Length Sequence Signal) is used.

The reason why voltage command Vs(t) obtained by adding voltages V0 and Vn is generated will be described later.

$$Vs(t) = V0 + Vn(t) \quad \text{(Equation 1)}$$

Based on voltage command Vs(t) generated by voltage command generating unit 1, for example, voltage Vs(t) is applied to the U phase and a voltage −Vs(t)/2 is applied to the V phase and the W phase to apply a single-phase applied voltage across the U-VW phases as in the drawing state (step S103). At this time, since a motor current flowing in PM motor 2 due to voltage command Vs(t) flows along the d-axis matched with the axis of magnetic poles, a torque that rotates the rotor of PM motor 2 is not generated. In this manner, in a state in which the rotor of PM motor 2 is stopped, data measurement to calculate a motor constant can be performed.

Current detectors 4a and 4b and current detecting unit 5 detect motor current Is(t) flowing when an applied voltage in step S103 is applied.

Voltage command Vs(t) applied in step S103 and motor current Is(t) serving as a response of voltage command Vs(t) are sampled and taken into as time-series data (step S104). In this case, since motor current Is(t) serves as a motor current to the single-phase applied voltage applied across the U-VW phases, a U-phase motor current is sampled.

By using a relationship between voltage command Vs(t) serving as an input of applied voltage time-series data and motor current Is(t) serving as an output of detection current time-series data, a frequency characteristic of transfer function H(s) from voltage command Vs(t) to motor current Is(t) is calculated (step S105). The frequency characteristic of transfer function H(s) can be obtained by performing an FFT (Fast Fourier Transform) process or the like to voltage command Vs(t) and motor current Is(t).

At this time, an equivalent circuit of the PM motor when voltage command Vs(t) is applied is as shown in FIG. 3, and a transfer function is expressed by Equation 2.

$$\frac{Is}{Vs} = \frac{(1/R)}{(L/R)s + 1} \quad \text{(Equation 2)}$$

The transfer function has primary delay characteristics in which a cut-off frequency and a DC (Direct Current) gain are given by R/L and 1/R, respectively.

In this case, a frequency characteristic of the transfer function shown in Equation 2 will be described with reference to FIG. 4A and FIG. 4B.

FIG. 4A is a graph showing a frequency characteristic of a transfer function (gain) of the PM motor. FIG. 4B is a graph showing a frequency characteristic of a transfer function (phase) of the PM motor.

As shown in FIG. 4A and FIG. 4B, relationships between a gain, a phase, and a frequency serving as the frequency characteristics of the transfer function of the PM motor are examined to make it possible to calculate cut-off frequency R/L and DC gain 1/R. At this time, for example, the cut-off frequency may be calculated as a frequency at which a DC gain of the gain characteristic lowers by about 3 dB or may be calculated as a frequency at which a phase is −45°. The DC gain may be calculated from a gain characteristic in a low-frequency band or may be calculated from a value obtained by adding about 3 dB to the DC gain at the cut-off frequency.

Electric time constant L/R serving as a motor constant can be calculated based on the inverse number of the cut-off frequency, phase resistance R is calculated based on an inverse number of the DC gain, and inductance L can be calculated based on the obtained cut-off frequency and the DC gain of the gain characteristic (step S106). Inductance L obtained as described above is an inductance of the d-axis.

As described above, according to the exemplary embodiment, the applied voltages including a DC component and a plurality of frequency components are applied to the PM motor to detect a motor current flowing depending on the applied voltages, so that a motor constant of the PM motor is calculated by using a relationship between the applied voltages and the detected motor current. More specifically, a motor constant can be calculated only by applying the applied voltages including a DC component and a plurality of frequency components to detect a motor current.

In this manner, a wait time until the motor current is in a steady state is not necessary, and a motor constant need not be calculated by applying a plurality of test signals. For this reason, a considerable time savings can be realized.

According to the exemplary embodiment, by using a frequency characteristic serving as a relationship between a voltage command and a motor current, a motor constant can be calculated. As a result, an influence such as noise is isolated to make it possible to calculate the motor constant at high accuracy. Furthermore, when the cut-off frequency is calculated as a frequency at which a phase is −45°, the cut-off frequency can be calculated at a point at which the maximum phase change can be obtained. For this reason, the cut-off frequency serving as a motor constant can be calculated at high accuracy.

Second Exemplary Embodiment

A motor constant calculating method and a motor constant calculating device for a PM motor in a second exemplary embodiment of the present invention will be described below with reference to the drawings.

The exemplary embodiment is different from the first exemplary embodiment in that the applied voltages including a plurality of different DC components are applied to a PM motor to calculate an inductance serving as a motor constant. Since the other configurations and operations are the same as those in the first exemplary embodiment, a description thereof will be omitted.

The reason why the applied voltages including a plurality of different DC components are applied to calculate an inductance serving as a motor constant will be described below.

In general, depending on the types of motors, an inductance serving as a motor constant of a motor changes by an influence such as magnetic saturation or the magnitude of a motor current. However, in the method of calculating an inductance serving as a motor constant in the first exemplary embodiment, only one inductance is calculated. For this reason, for the above reason, when the motor constants change, the motor may not be able to be controlled with an accurate inductance.

Operations and functions of functional blocks in the exemplary embodiment will be concretely described below with reference to FIG. 5 and FIG. 6 in addition to FIG. 1.

Figure 5:
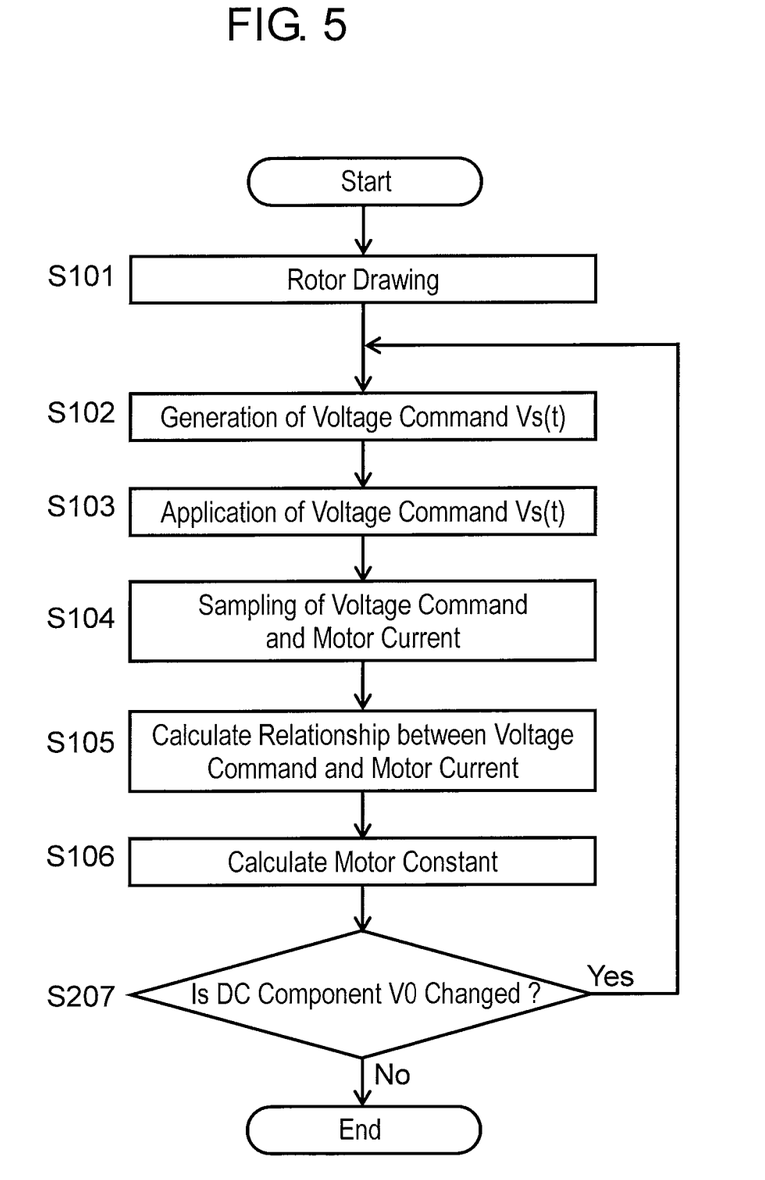
FIG. 5 is a flow chart showing a flow of a process of calculating a motor constant in a second exemplary embodiment of the present invention.

FIG. 5 is a flow chart showing a flow of a process of calculating a motor constant in the second exemplary embodiment of the present invention. FIG. 6 is a diagram showing a relationship between a motor current and an inductance in the exemplary embodiment. Since, in step S101 to step S106 in FIG. 5, the same processes as in the first exemplary embodiment described with reference to FIG. 2 are performed, a description thereof will be omitted.

More specifically, since in FIG. 5, a process in step S207 is added to the steps in FIG. 2, details of the added steps will be described.

As shown in FIG. 5, after the processes from step S101 to step S106 are executed, it is determined whether all the applied voltages having a plurality of DC components V0 are set in generation of a voltage command in step S102 (step S207). In this case, the applied voltages having the plurality of DC components V0 are set in the range of zero to a voltage value obtained when the maximum current defined as a specification of PM motor 2 flows in advance.

At this time, when the applied voltages having the plurality of DC components V0 include an unset value (applied voltage) (Yes in step S207), one unset value (applied voltage) of the applied voltages having the plurality of DC components V0 is selected, and the operation returns to step S102. The processes from step S102 to step S106 are sequentially repeatedly executed to calculate a motor constant of the PM motor to each applied voltage of the plurality of DC components.

On the other hand, when all the values of the applied voltages having the plurality of DC components V0 are executed (No in step S207), the motor constant calculating process is end.

Figure 6:
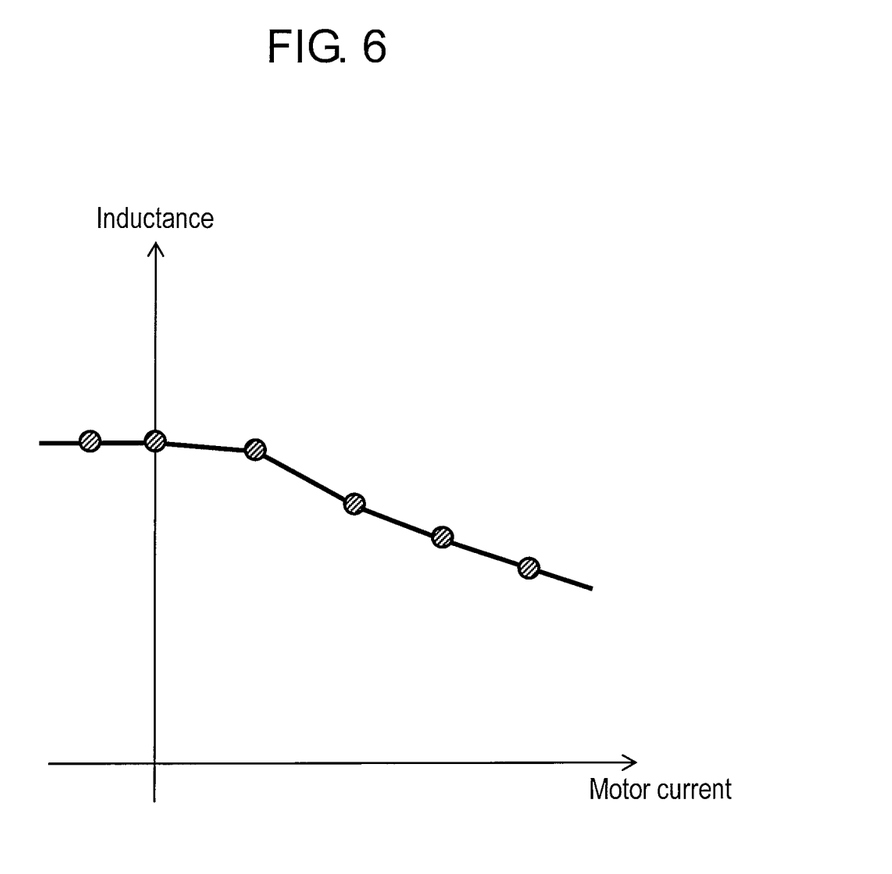
FIG. 6 is a diagram showing a relationship between a motor current and an inductance in the second exemplary embodiment.

More specifically, the processes from step S102 to step S106 are repeated to set a plurality of applied voltages having DC components V0, so that a plurality of relationships between an average value of motor currents corresponding to the applied voltages having DC components V0 as shown in FIG. 6 and the inductance serving as the calculated motor constant are obtained.

Based on the relationships shown in FIG. 6, for example, inductances serving as a plurality of motor constants corresponding to motor currents of the PM motor can be calculated.

In this manner, in consideration of even a change in motor current, inductances serving as a plurality of motor constants can be stably calculated at high accuracy.

As described above, according to the exemplary embodiment, an applied voltage including a plurality of DC components and a plurality of frequency components are applied to the PM motor to detect a plurality of motor currents flowing depending on the plurality of applied voltage, so that a motor constant of the PM motor is calculated by using a relationship between the plurality of applied voltage and the detected motor currents.

In this manner, the motor constants depending on the changing motor currents can be calculated.

Each of the exemplary embodiments describes the method of calculating a motor constant of a PM motor. However, not only the method but also any configuration or any embodying method may be used as long as the configuration and the method have the same functions as those in the above exemplary embodiments, as a matter of course. For example, functional blocks except for PM motor 2 in the block diagram in FIG. 1 may be incorporated as one function of a motor constant calculating device for a PM motor and functioned by setting. Voltage command generating unit 1 and motor constant calculating unit 6 may be configured as application software for PC (Personal Computer) interlocked with a motor constant calculating device for a PM motor. In this manner, the configuration of the motor constant calculating device can be simplified.

An applied voltage in the drawing process (step S101) is set to Va. However, when the rotor of the PM motor is drawn, the applied voltage may be set to an arbitrary different value.

Each of the exemplary embodiments describes the example in which M-sequence signals are used as signals including a plurality of frequency components added to voltage command Vs(t). The present invention is not limited to the example. For example, when a frequency characteristic can be calculated, another signal, i.e., a sinusoidal signal such as a white-noise signal or a sinusoidal sweep signal the frequency of which changes with time may be used. In this manner, as needed, the frequency characteristic can be calculated by an arbitrary signal.

Each of the exemplary embodiments describes the example in which a frequency characteristic of motor current Is(t) is calculated based on applied voltage command Vs(t). However, the present invention is not limited to the example. When an element, for example, a filter process or a delay element except for the PM motor is present, time-series data the influence of which is compensated for may be added to voltage command Vs(t) to calculate a frequency characteristic. In this manner, the motor constant of the PM motor can further be calculated at higher accuracy.

Each of the exemplary embodiments describes the example in which the motor is fixed to a predetermined position after the drawing process to detect a motor current. However, the present invention is not limited to the example. For example, voltage commands Vs(t) may be applied in directions having different electric phases with respect to the position of an axis of magnetic poles after the drawing process to detect motor currents flowing in the directions. More specifically, 0, Vs(t), and −Vs are applied to a U phase, a V phase, and a W phase, respectively, such that a single-phase applied voltage is applied to an electric axis (q-axis) having an electric phase different by 90° from the position of the axis of magnetic poles after the drawing process, i.e., across the V-W phases, and V-phase motor currents having the same direction may be detected. In this manner, in a PM motor in which motor constants change depending on positions of axes of magnetic poles, for example, an interior permanent magnet (PM) motor or the like, an electric phase in which voltage command Vs(t) is applied can be arbitrarily set. For this reason, motor constants depending on the positions of the axes of magnetic poles can be calculated at high accuracy. In particular, when voltage command Vs(t) is applied to the q-axis to calculate a motor constant, an inductance of the q-axis can be calculated.

Each of the exemplary embodiments describes the example in which the inductance of the d-axis is calculated. However, the present invention is not limited to the example. For example, in a PM motor in which inductances do not change depending on positions of axes of magnetic poles, a calculated inductance of the d-axis may be used as an inductance of the q-axis. In this manner, the inductance of the q-axis can be calculated without fixing the rotor of the PM motor to a predetermined position.

The present invention includes the voltage applying step of applying an applied voltage including a DC component and a plurality of frequency components to a PM motor, the motor current detecting step of detecting a motor current flowing depending on the applied voltage, and the motor constant calculating step of calculating a motor constant of the PM motor based on frequency characteristics of the applied voltage and the motor current. In this manner, a motor constant can be calculated at high accuracy within a short period of time.

The present invention uses the applied voltage having a plurality of different DC components in the step of applying a voltage. In this manner, according to a change in the magnitude of motor current, inductances serving as motor constants can be calculated at high accuracy within a short period of time.

INDUSTRIAL APPLICABILITY

Since a motor constant calculating method and a motor constant calculating device for a PM motor according to the present invention can calculate motor constants of a PM motor at high accuracy within a short period of time, the present invention is useful throughout a control device for a PM motor that requires a motor constant.

REFERENCE MARKS IN THE DRAWINGS 1 voltage command generating unit
2 PM motor
3 inverter
4a, 4b current detector
5 current detecting unit
6 motor constant calculating unit

The invention claimed is:

1. A motor constant calculating method for a PM motor, comprising:
   a voltage applying step of applying to a PM motor a voltage command including a DC component and a plurality of frequency components;
   a motor current detecting step of detecting a responsive motor current flowing through the PM motor in response to application of the voltage command applied in the voltage applying step;
   a motor frequency characteristic determining step of calculating a transfer function between the applied voltage command and the detected responsive motor current and determining a frequency characteristic of the transfer function; and
   a motor constant calculating step of calculating a motor constant of the PM motor based on the determined frequency characteristic of the transfer function.

2. The motor constant calculating method for a PM motor according to claim 1, further comprising repeating the voltage applying step while changing a value of the DC component.

3. The motor constant calculating method for a PM motor according to claim 1, wherein the plurality of frequency components of the voltage command is a white noise.

4. The motor constant calculating method for a PM motor according to claim 1, wherein the plurality of frequency components of the voltage command is an M-sequence signal.

5. The motor constant calculating method for a PM motor according to claim 1, wherein the plurality of frequency components of the voltage command is a sinusoidal wave whose frequency changes with time.

6. The motor constant calculating method for a PM motor according to claim 1, wherein the motor constant calculating step comprises calculating the transfer function, in which the voltage command is taken as a temporal series of inputs, and the detected responsive motor current is taken as a temporal series of outputs.

7. The motor constant calculating method for a PM motor according to claim 1, wherein the motor constant of the PM motor calculated in the motor constant calculating step comprises at least one of an electric time constant, a resistance, and an inductance of the PM motor.

8. The motor constant calculating method for a PM motor according to claim 7, wherein the motor constant calculating step comprises determining a cut-off frequency of the frequency characteristic of the transfer function, and determining the electric time constant of the PM motor from the determined cut-off frequency.

9. The motor constant calculating method for a PM motor according to claim 7, wherein the motor constant calculating step comprises determining a cut-off frequency based on a frequency characteristic of a gain derived from the transfer function, and determining the resistance of the PM motor based on the frequency characteristic of the gain derived from the transfer function in a frequency band lower than the cut-off frequency.

10. The motor constant calculating method for a PM motor according to claim 7, wherein the motor constant calculating step comprises determining a cut-off frequency based on a frequency characteristic of a gain derived from the transfer function, and determining the resistance of the PM motor based on the frequency characteristic of the gain derived from the transfer function at the cut-off frequency.

11. The motor constant calculating method for a PM motor according to claim 7, wherein the motor constant calculating step comprises determining a cut-off frequency based on a frequency characteristic of a gain derived from the transfer function, determining the electric time constant of the PM motor based on the cut-off frequency, determining the resistance of the PM motor based on the frequency characteristic of the gain derived from the transfer function in a frequency band lower than the cut-off frequency or the frequency characteristic of the gain derived from the transfer function at the cut-off frequency, and calculating the inductance of the PM motor based on the determined electric time constant and the determined resistance.

12. A motor constant calculating device for a PM motor, comprising:
    a voltage command generating unit configured to generate a voltage command to be applied to a PM motor, wherein the voltage command comprises a DC component and a plurality of frequency components;
    a current detecting unit configured to detect a responsive motor current flowing through the PM motor in response to application of the voltage command; and
    a motor constant calculating unit configured to:
        calculate a transfer function between the applied voltage command and the detected responsive motor current;
        determine a frequency characteristic of the transfer function; and
        calculate a motor constant of the PM motor based on the determined frequency characteristic of the transfer function.

13. The motor constant calculating method for a PM motor according to claim 2, wherein the plurality of frequency components of the voltage command is a white noise.

14. The motor constant calculating method for a PM motor according to claim 2, wherein the plurality of frequency components of the voltage command is an M-sequence signal.

\* \* \* \* \*